US011800724B2

(12) United States Patent
Chuang et al.

(10) Patent No.: US 11,800,724 B2
(45) Date of Patent: Oct. 24, 2023

(54) MRAM MEMORY CELL LAYOUT FOR MINIMIZING BITCELL AREA

(71) Applicant: Taiwan Semiconductor Manufacturing Co., Ltd., Hsinchu (TW)

(72) Inventors: Harry-Hak-Lay Chuang, Hsinchu (TW); Wen-Chun You, Hsinchu (TW); Hung Cho Wang, Hsinchu (TW); Yen-Yu Shih, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 17/562,949

(22) Filed: Dec. 27, 2021

(65) Prior Publication Data

US 2022/0123051 A1    Apr. 21, 2022

Related U.S. Application Data

(62) Division of application No. 16/893,010, filed on Jun. 4, 2020, now Pat. No. 11,244,983.

(60) Provisional application No. 62/866,361, filed on Jun. 25, 2019.

(51) Int. Cl.
*H10B 61/00* (2023.01)
*H10N 50/01* (2023.01)
*H10N 50/80* (2023.01)

(52) U.S. Cl.
CPC ............. *H10B 61/22* (2023.02); *H10N 50/01* (2023.02); *H10N 50/80* (2023.02)

(58) Field of Classification Search
CPC ....... H01L 27/228; H01L 43/02; H01L 43/12; H10B 61/22; H10N 50/80; H10N 50/01

USPC ........................................................ 257/427
See application file for complete search history.

(56) References Cited

U.S. PATENT DOCUMENTS

| 5,915,167 | A | 6/1999 | Leedy |
| 6,512,690 | B1 | 1/2003 | Qi et al. |
| 7,995,378 | B2 | 8/2011 | Yoon et al. |
| 8,159,870 | B2 | 4/2012 | Xia |
| 10,290,679 | B1 * | 5/2019 | Bhushan ................. H01L 43/08 |

(Continued)

FOREIGN PATENT DOCUMENTS

| JP | 2012-221546 A | 11/2012 |
| KR | 10-2010-0097743 A | 9/2010 |

(Continued)

*Primary Examiner* — Tu-Tu V Ho
(74) *Attorney, Agent, or Firm* — SEED IP LAW GROUP LLP

(57) ABSTRACT

An MRAM memory cell includes a substrate and a transistor. The transistor includes: first and second source regions; a drain region between the first and second source regions; a first channel region between the drain region and the first source region; a second channel region between the drain region and the second source region; a first gate structure over the first channel region; and a second gate structure over the second channel region. A magnetic tunnel junction is overlying the transistor. The drain region is coupled to the magnetic tunnel junction. A first metal layer is overlying the transistor, and a second metal layer is overlying the first metal layer. The second and first metal layers couple a common source line signal to the first and second source regions of the MRAM memory cell and to those of a neighboring MRAM memory cell.

20 Claims, 12 Drawing Sheets

(56) References Cited

U.S. PATENT DOCUMENTS

| | | |
|---|---|---|
| 2012/0008361 A1 | 1/2012 | Lee |
| 2012/0257444 A1 | 10/2012 | Oh |
| 2016/0020249 A1 | 1/2016 | Ko et al. |
| 2016/0020251 A1 | 1/2016 | Kim et al. |
| 2016/0043136 A1 | 2/2016 | Kim et al. |
| 2016/0315248 A1* | 10/2016 | Zhu ..................... H01L 27/228 |
| 2018/0040813 A1 | 2/2018 | Han et al. |
| 2019/0165260 A1 | 5/2019 | Yu et al. |

FOREIGN PATENT DOCUMENTS

| | | |
|---|---|---|
| KR | 10-2010-0125478 A | 11/2010 |
| KR | 10-2012-0004711 A | 1/2012 |
| KR | 10-2016-0018270 A | 2/2016 |
| KR | 10-2019-0064395 A | 6/2019 |
| TW | 201639121 A | 11/2016 |
| TW | 201735409 A | 10/2017 |
| TW | 201743330 A | 12/2017 |
| TW | 201743482 A | 12/2017 |
| TW | 201836179 A | 10/2018 |
| TW | 201916145 A | 4/2019 |

\* cited by examiner

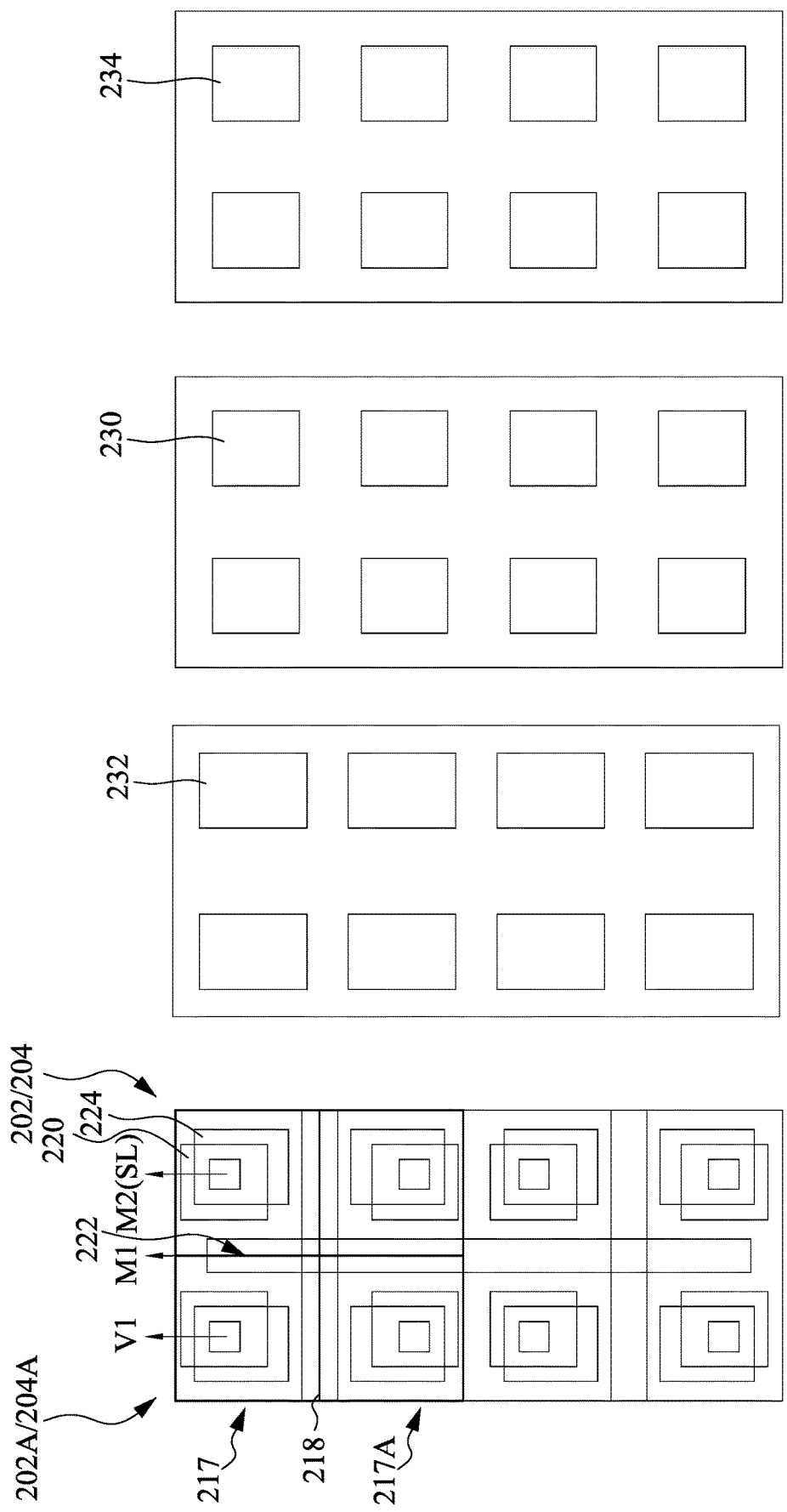

MRAM MEMORY CELL LAYOUT FOR MINIMIZING BITCELL AREA

BACKGROUND

MRAM memory cell arrays include magnetic tunnel junctions for storing bits of data and field effect transistors, such as metal-oxide field effect transistors (MOSFETs), for driving the magnetic tunnel junctions to perform read and write operations. When fabricating MRAM memory cells using semiconductor processing technology above 20 nm node, such as 22 nm node or greater, the layout and/or geometry of back-end-of-line (BEOL) metallization, including metal layers forming the magnetic tunnel junction, as well as the layout and/or geometry of the driving MOSFETs, are significant in reducing bitcell areas.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A is a top-down view of the first and second metal layers overlying the substrate/transistors of the pair of bitcells of FIG. 9 and the neighboring substrate/transistors of three neighboring pairs of bitcells, according to an embodiment of the present disclosure;

FIG. 10B is a top-down view of the third metal layer overlying the substrate/transistors of the pair of bitcells of FIG. 9 and the neighboring substrate/transistors of three neighboring pairs of bitcells, according to an embodiment of the present disclosure;

FIG. 10C is a top-down view of the fourth metal layer overlying the substrate/transistors of the pair of bitcells of FIG. 9 and the neighboring substrate/transistors of three neighboring pairs of bitcells, according to an embodiment of the present disclosure;

FIG. 10D is a top-down view of the fifth metal layer overlying the substrate/transistors of the pair of bitcells of FIG. 9 and the neighboring substrate/transistors of three neighboring pairs of bitcells, according to an embodiment of the present disclosure;

DETAILED DESCRIPTION

Figure 1:
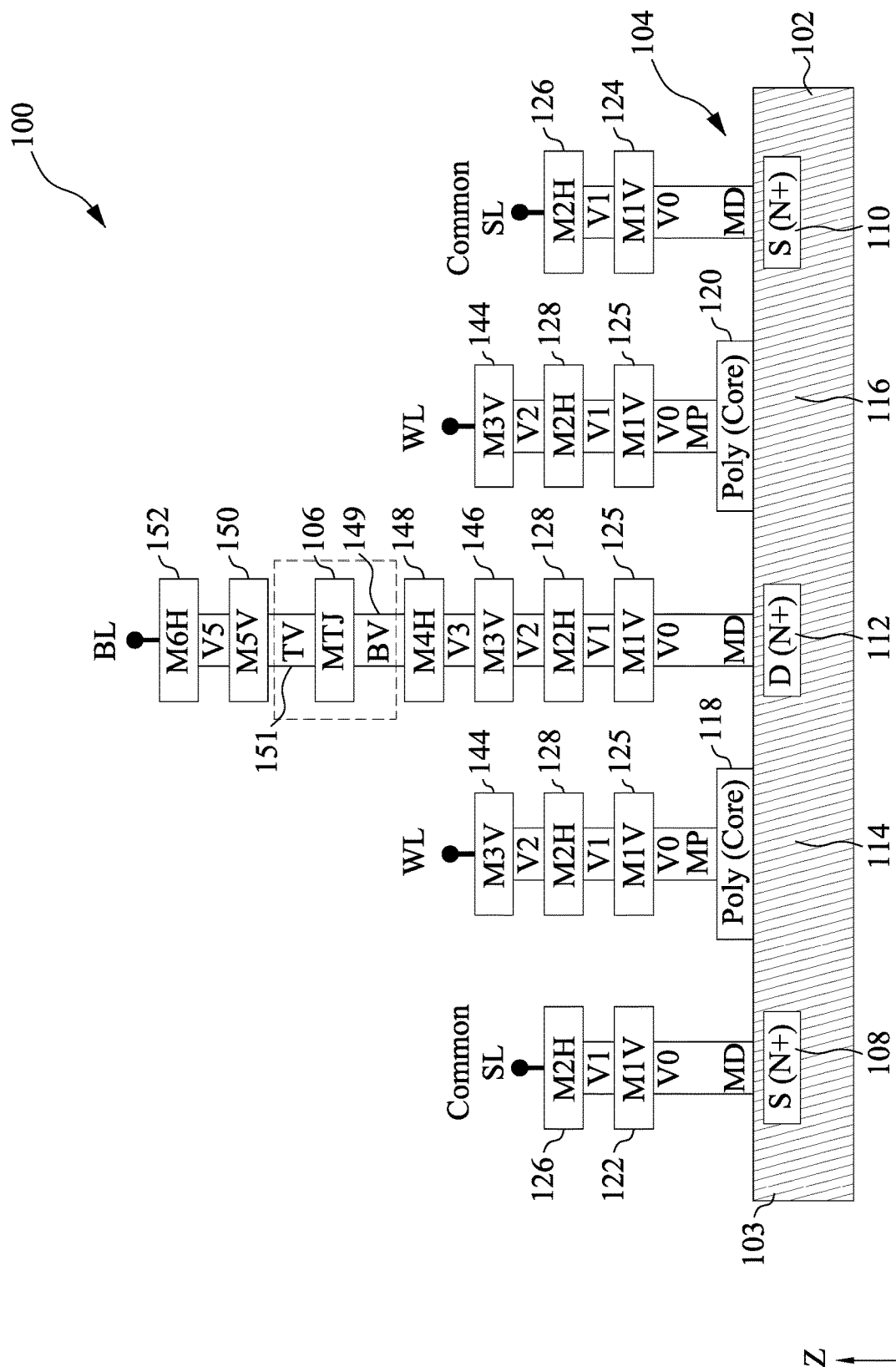
FIG. 1 is an x-z cross-section of a MRAM memory cell, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A MRAM memory cell array includes a plurality of bitcells. Each bitcell, also referred to as a MRAM memory cell, includes a transistor formed in or on a substrate, such as a silicon substrate or an oxide substrate overlying a silicon base layer, and a magnetic tunnel junction overlying the substrate and the transistor. Each bitcell also includes a plurality of metal layers (i.e., BEOL metal layers) overlying the substrate and the transistor. Some of the metal layers or segments of the metal layers may be used as bit lines, word lines and source lines that are coupled to the drains, gates and sources of transistors, and may be configured to receive external signals, such as voltage signals, for driving the magnetic tunnel junctions. As transistors become smaller, the dimensions of the BEOL metal must also be reduced in order to reduce the bitcell layout. However, parameters of BEOL metal, such as metal pitch and widths of metal lines, are governed by corresponding processing procedures, such as the processing steps performed under one-photolithography-one-etch (1P1E) processing technology or other processing technologies.

The present disclosure describes embodiments of MRAM memory cells having reduced bitcell areas based on the BEOL metal layers and/or the underlying transistors used to drive the corresponding magnetic tunnel junctions.

FIG. 1 is an x-z cross-section of a MRAM memory cell 100, according to an embodiment of the present disclosure. The MRAM memory cell 100 includes a substrate 102, a transistor 104 and a magnetic tunnel junction (MTJ) 106. The transistor 104 is configured to drive the MTJ 106 for writing data to the MTJ 106 and reading data from the MTJ 106. The MTJ 106 is configured to store a bit of data. As will be discussed in more detail further below, the value of the bit of data stored by the magnetic tunnel junction is based upon the relative magnetic alignment between ferromagnetic layers of the MTJ 106.

The transistor 104 includes a first source region 108 formed in the substrate 102, a second source region 110 formed in the substrate 102 and a drain region 112 formed in the substrate 102 between the first and second source regions 108, 110. The transistor 104 further includes at least one first channel region 114 formed in the substrate 102 between the drain region 112 and the first source region 108, and at least one second channel region 116 formed in the substrate 102 between the drain region 112 and the second source region 110. In addition, the transistor 104 includes a first gate structure 118 overlying the at least one first channel region 114 and a second gate structure 120 overlying the at least one second channel region 116. In one embodiment, the transistor 104 is a field-effect transistor (FET), such as a metal-oxide-semiconductor field-effect transistor (MOSFET). The transistor 104 may by formed as a planar FET or as non-planar FFT, such as a fin field-effect transistors (FinFET). FinFETs may have one or more non-planar gate structures for wrapping partially or completely around one or more channel regions.

Although FIG. 1 illustrates the source/drain regions and the channel regions as embedded in the substrate 102, the scope of the present invention includes embodiments in which the source/drain regions and channel regions are on the substrate 102 (e.g., on a surface of the substrate 102) and embodiments in which the source/drain regions and channel regions have respective first portions in the substrate 102 and respective second portions that extend from the respective first portions above the substrate (e.g., above a surface of the substrate). Further, the substrate 102 may include vertical protrusion portions, e.g., fin portions, which can be configured to become channel regions and/or source/drain regions.

According to an embodiment, the substrate 102 may be a formed of silicon, or other semiconductor materials, such as GaAs, and the source and drain regions 108, 110, 112 may be n+ (p+) doped regions and the channel regions 114, 116 may be a p (n) doped regions. P-FETs, N-FETs, P-FinFETs and N-FinFETS are known in the art and will not be discussed in detail.

The magnetic tunnel junction 106 overlies the substrate 102 and is coupled to the drain region 112 via plurality of metal layers and vias. A common source line (SL) is coupled to the first and second source regions 108, 110. In addition, and as discussed further below, the common SL is configured to couple to first and second source regions of a neighboring transistor of a neighboring MRAM memory cell. According to an embodiment of the present disclosure, the MRAM memory cell 100 may include at least six metal layers overlying the substrate 102 and vias for connecting the metal layers, or segments of the metal layers, to one another. The six or more metal layers may be referred collectively as back-end-of-line (BEOL) metallization that couples transistors and other components formed in or on the substrate 102 with other circuitry, components, data lines, and power sources.

Figure 2:
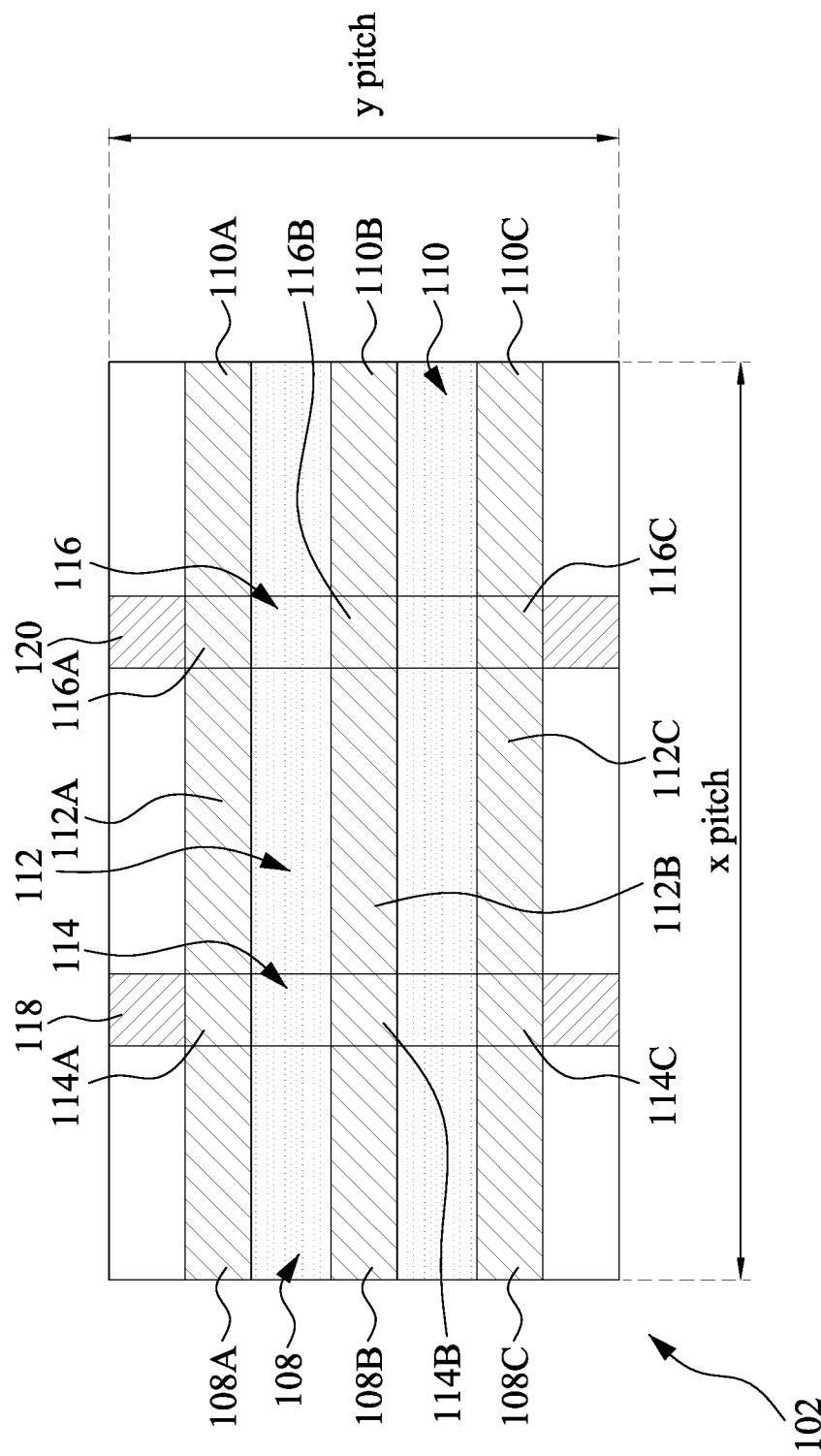
FIG. 2 is a top-down view of the substrate/transistor of the MRAM memory cell of FIG. 1, according to an embodiment of the present disclosure.

FIG. 2 is a top-down view of the substrate/transistor of the MRAM memory cell 100 of FIG. 1, according to an embodiment of the present disclosure. The first channel region 114 of the transistor 104 includes three first channel regions 114A, 114B, 114C and the second channel region 116 includes three second channel regions 116A, 116B, 116C. Furthermore, the first and second source regions 108, 110 may include three first source regions 108A, 108B, 108C and three second source regions 110A, 110B, 110C, respectively, and the drain region 112 may include three drain regions 112A, 112B, 112C. In one embodiment, each region of the three channel, source and drain regions may be configured as fins that either extend vertically from a top surface 103 (FIG. 1) of the substrate 102 or are positioned on the top surface 103 of the substrate 102.

The x-pitch of the MRAM memory cell 100 is the distance (i.e., length) between the first source region 108 and the second source region 110 and the y-pitch of the MRAM memory cell 100 is the width of the MRAM memory cell 100. In one embodiment, the x-pitch of the MRAM memory cell 100 is 0.09-0.27 um and the y-pitch is 0.096-0.24 um. In another embodiment, the x-pitch is 0.18 um and the y-pitch is 0.192 um.

Figure 3:
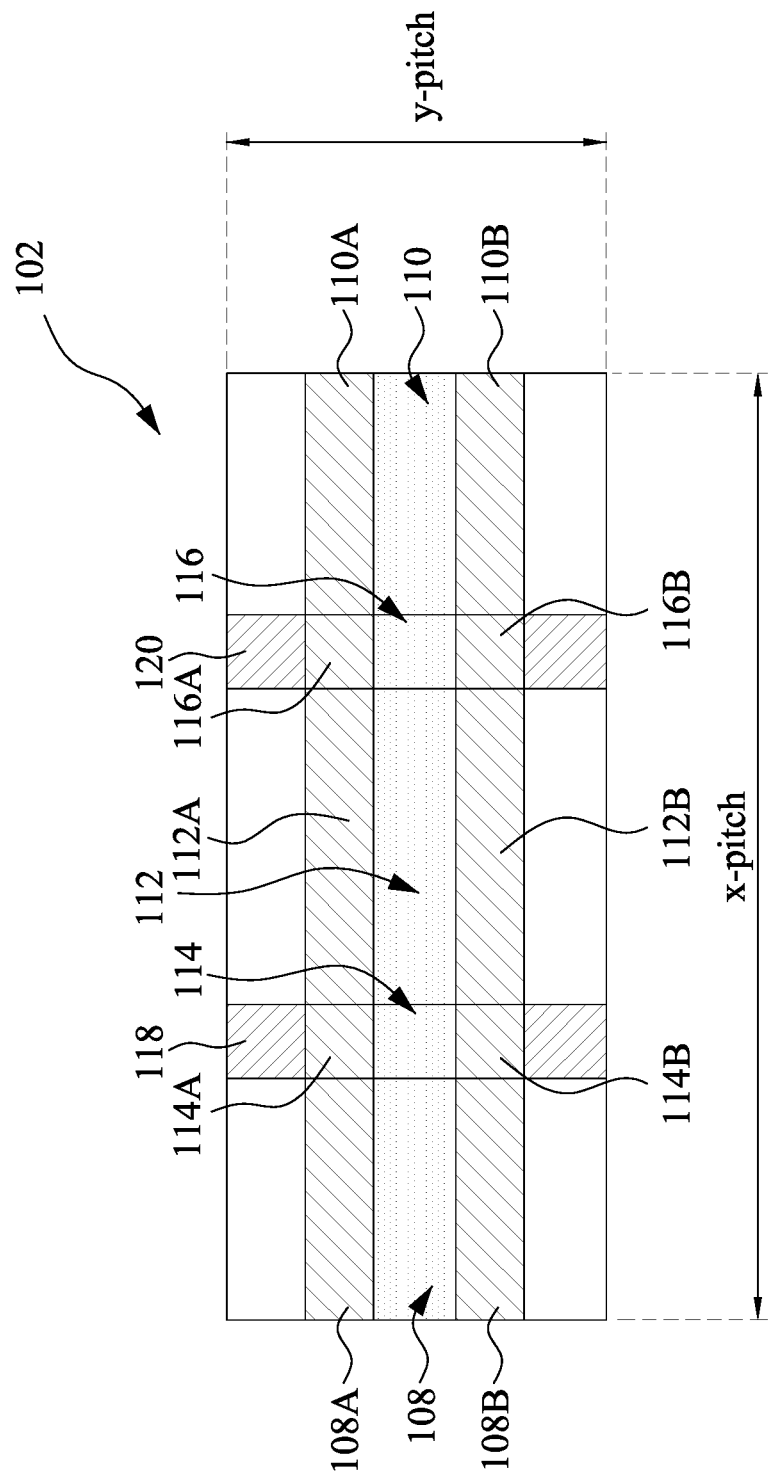
FIG. 3 is a top-down view of the substrate/transistor of the MRAM memory cell of FIG. 1, according to another embodiment of the present disclosure.

FIG. 3 is a top-down view of the substrate/transistor of the MRAM memory cell 100 of FIG. 1, according to another embodiment of the present disclosure. The first channel region 114 of the transistor 104 includes two first channel regions 114A, 114B and the second channel region 116 includes two second channel regions 116A, 116B. Furthermore, the first and second source regions 108, 110 may include two first source region 108A, 108B and two second source regions 110A, 110B, respectively, and the drain region 112 may include two drain regions 112A, 112B. In one embodiment, each region of the two channel, source and drain regions may be configured as fins that either extend vertically from a top surface 103 (FIG. 1) of the substrate 102 or are positioned on the top surface 103 of the substrate 102. For example, the source or drain regions 108, 110, 112 may be epitaxy semiconductor layers formed over the substrate 102. In one embodiment, the x-pitch of the MRAM memory cell 100 is 0.09-0.27 um and the y-pitch is 0.096-0.24 um. In another embodiment, the x-pitch is 0.18 um and the y-pitch is 0.144 um.

Figure 4:
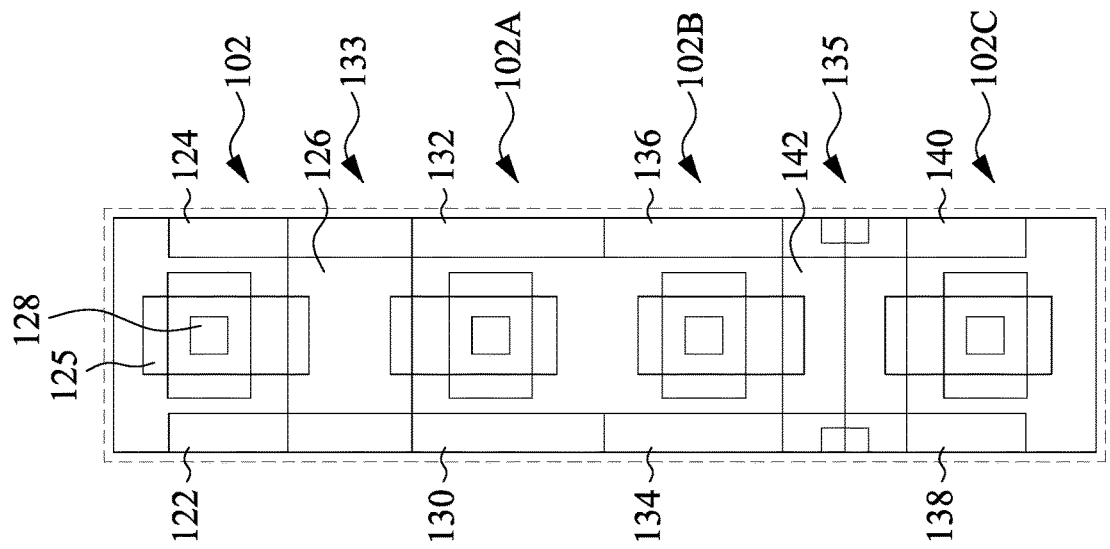
FIG. 4 is a top-down view of first and second metal layers overlying the substrate/transistor of the MRAM memory cell of FIG. 1 and neighboring substrate/transistors associated with three neighboring MRAM memory cells, according to an embodiment of the present disclosure.

FIG. 4 is a top-down view of first and second metal layers overlying the substrate/transistor of the MRAM memory cell 100 of FIG. 1 and neighboring substrate/transistors associated with three neighboring MRAM memory cells, according to an embodiment of the present disclosure. Referring to FIGS. 1 and 4 together, each of the three neighboring MRAM memory cells is identical to the MRAM memory cell 100. The MRAM memory cell 100 includes a first metal layer overlying the substrate 102. The first metal layer includes a first segment 122 coupled to the first source region 108 and a second segment 124 coupled to the second source region 110. The first and second segments 122, 124 of the first metal layer may be collectively referred to as a first portion of the first metal layer. The MRAM memory cell 100 further includes a second metal layer overlying the first metal layer. The second metal layer includes a first segment 126 and a second segment 128. The first segment 126 of the second metal layer is coupled to the first and second segments 122, 124 of the first metal layer (i.e., the first portion of the first metal layer). The first segment 126 of the second metal layer is configured as the common source line.

A second portion of the first metal layer having first and second segments 130, 132 are coupled to first neighboring first and second source regions of a first neighboring transistor formed in the substrate 102A and associated with a first neighboring MRAM memory cell, and the common source line 126 is further coupled to the second portion of the first metal layer for forming two bitcells (i.e., a pair of bitcells 133) that include the MRAM memory cell 100 and the first neighboring MRAM memory cell associated with the substrate 102A. The pair of bitcells 133 receive a common source line signal (e.g., voltage) via the common source line 126.

According to another embodiment, a third portion of the first metal layer having first and second segments 134, 136 are coupled to second neighboring first and second source regions of a second neighboring transistor formed in the substrate 102B and associated with a second neighboring MRAM memory cell, and a fourth portion of the first metal layer having first and second segments 138, 140 are coupled to third neighboring first and second source regions of a third neighboring transistor formed in the substrate 102C and associated with a third neighboring MRAM memory cell. The common source line 126 may be coupled with a third segment 142 of the second metal layer (also referred to as a second common source line) that is coupled to the third and fourth portions of the first metal layer for forming four bitcells (i.e., the pair of bitcells 133 and a pair of bitcells 135). The four bitcells are configured to receive the common source line signal via the common source line 126 and the second common source line 142.

Figure 5:
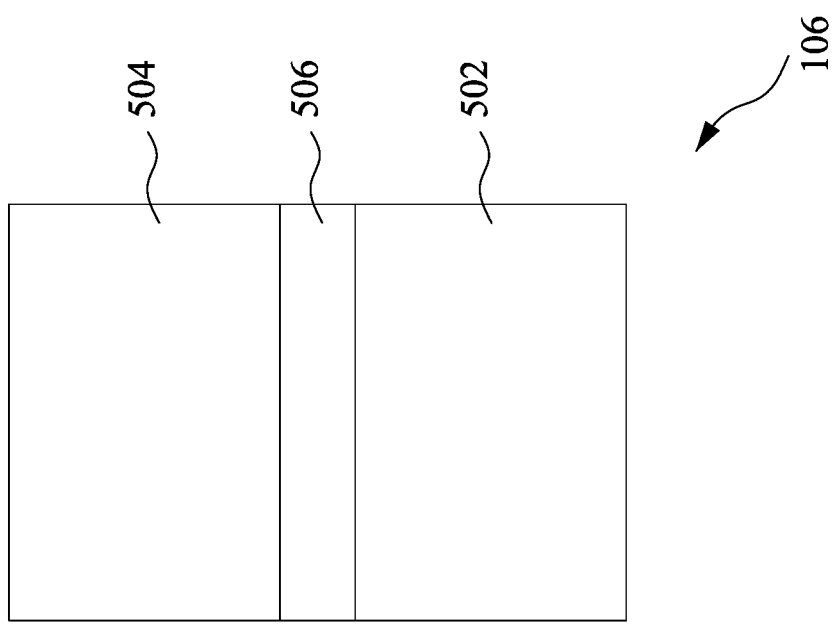
FIG. 5 illustrates the magnetic tunnel junction of FIG. 1, according to an embodiment of the present disclosure.

FIG. 5 illustrates the magnetic tunnel junction (MTJ) 106, according to an embodiment of the present disclosure. The magnetic tunnel junction 106 includes a lower ferromagnetic layer 502, an upper ferromagnetic layer 504 and a tunnel barrier layer 506 positioned between the lower ferromagnetic layer 502 and the upper ferromagnetic layer 504. In one embodiment, the lower ferromagnetic layer 502 is a pinned ferromagnetic layer, the tunnel barrier layer 506 is a thin insulating layer (e.g., a few nanometers thick), and the upper ferromagnetic layer 504 is a free ferromagnetic layer. The orientation of the magnetic field of the pinned layer 502 may be fixed, and the orientation of the free layer 504 may be adjusted to be either parallel or antiparallel (i.e., in an opposite direction) to the orientation of the magnetic field of the pinned layer 502, thereby representing one of two states of a bit stored in the MTJ 106 of the MRAM memory cell 100. In one embodiment, the orientation of the magnetic fields may be placed in parallel and antiparallel states by driving a current, having a magnitude greater than a predefined current threshold, through the magnetic tunnel junction 106 in one of two directions (i.e., either from a bit line (BL, FIG. 1) to the drain region 112 or from the drain region 112 to the BL) during a write operation. Since the resistance of the MTJ 106 is greater when the magnetic fields are antiparallel to one another, a value of the bit stored in the MTJ 106 may be determined by measuring the resistance of the MTJ 106 during a read operation. However, the scope of the present disclosure covers other known methods of driving magnetic tunnel junctions for performing read and write operations.

Figure 6C:
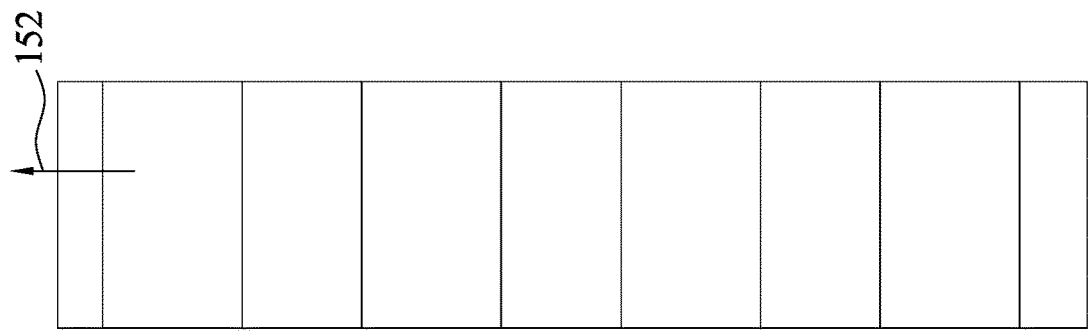
FIG. 6C is a top-down view of a sixth metal layer overlying the substrate/transistor of MRAM memory cell of FIG. 1 and neighboring substrate/transistors associated with three neighboring MRAM memory cells, according to an embodiments of the present disclosure.
Figure 6B:
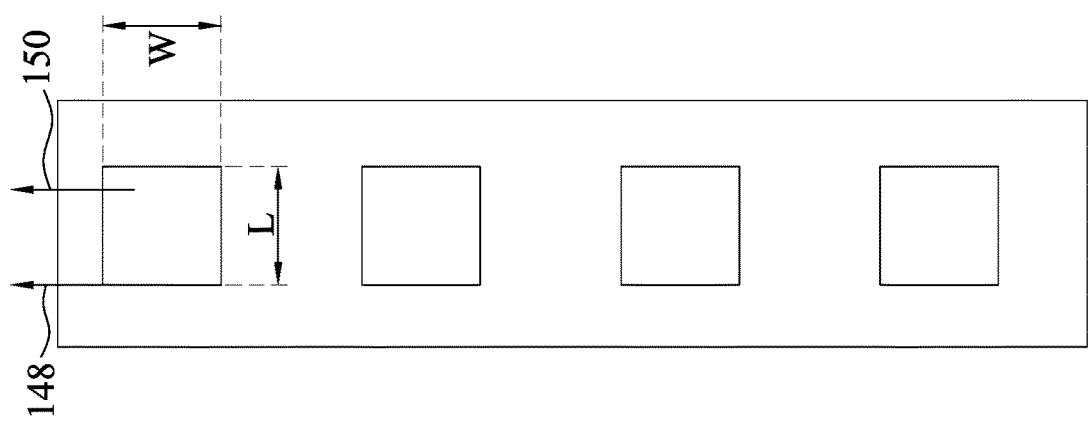
FIG. 6B is a top-down view of fourth and fifth metal layers overlying the substrate/transistor of MRAM memory cell of FIG. 1 and neighboring substrate/transistors associated with three neighboring MRAM memory cells, according to an embodiment of the present disclosure.
Figure 6A:
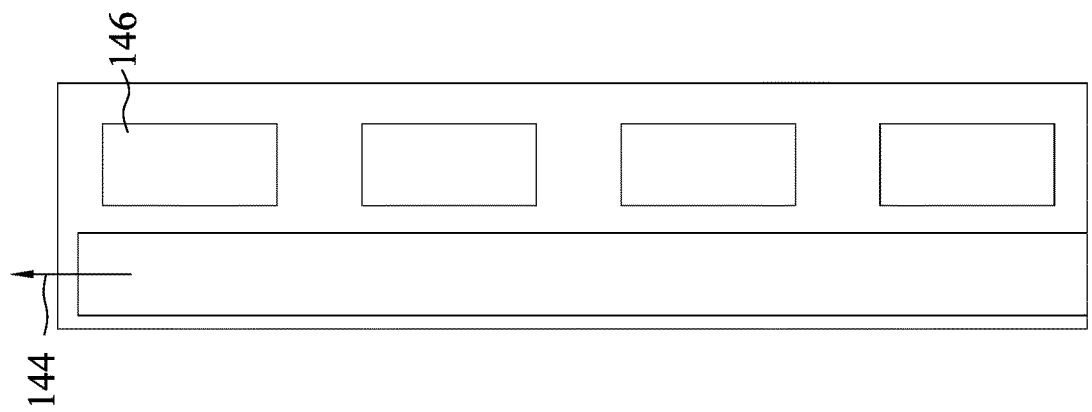
FIG. 6A is a top-down view of a third metal layer overlying the substrate/transistor of the MRAM memory cell of FIG. 1 and neighboring substrate/transistors associated with three neighboring MRAM memory cells, according to an embodiment of the present disclosure.

The following description references FIGS. 6A-6C. FIG. 6A is a top-down view of a third metal layer overlying the substrate/transistor of MRAM memory cell 100 of FIG. 1 and the neighboring substrate/transistors associated with three neighboring MRAM memory cells, FIG. 6B is a top-down view of fourth and fifth metal layers overlying the substrate/transistor of MRAM memory cell 100 of FIG. 1 and the neighboring substrate/transistors associated with three neighboring MRAM memory cells and FIG. 6C is a top-down view of a sixth metal layer overlying the substrate/transistor of MRAM memory cell 100 of FIG. 1 and the neighboring substrate/transistors associated with three neighboring MRAM memory cells, according to an embodiment of the present disclosure. Each of the three neighboring MRAM memory cells is identical to the MRAM memory cell 100.

Referring to FIGS. 1, 6A, 6B and 6C together, the MRAM memory cell 100 includes a third metal layer overlying the substrate 102. The third metal layer may include a first segment 144 and a second segment 146. In one embodiment, the first segment 144 of the third metal layer is configured as a word line (WL) and is coupled to the first and second gate structures 118, 120. In one embodiment, the WL is coupled to the first and second gate structures 118, 120 via the second segment 128 of the second metal layer and a third segment 125 (FIG. 4) of the first metal layer.

The MRAM memory cell 100 includes a fourth metal layer 148 overlying the substrate 102 and configured as a lower metal contact island coupled to the lower ferromagnetic layer 502 via a bottom via 149 (FIG. 1). The fourth metal layer 148 is also coupled to the drain region 112. In one embodiment, the lower metal contact island 148 is coupled to the drain region 112 via the second segment 146 of the third metal layer, the second segment 128 of the second metal layer and the third segment 125 of the first metal layer. The MRAM memory cell 100 includes a fifth metal layer 150 overlying the substrate 102 and configured as an upper metal contact island coupled to the upper ferromagnetic layer 504 via a top via 151. The MRAM memory cell 100 includes a sixth metal layer 152 overlying the substrate 102 and configured as a bit line (BL) coupled to the fifth metal layer 150.

According to another embodiment, the MRAM memory cell 100 that includes the transistor 104 having the two first channel regions 114A, 114B and the two second channel regions 116A, 116B, as illustrated by FIG. 3, includes the lower metal contact island 148 having a length of 0.08 um and a width of 0.06 um and the upper metal contact island 150 having a length of 0.1 um and a width of 0.08 um.

According to another embodiment, the MRAM memory cell 100 that includes the transistor 104 having the three first channel regions 114A, 114B, 114C and the three second channel regions 116A, 116B, 116C, as illustrated by FIG. 2, includes the lower metal contact island 148 having a length of 0.1 um and a width of 0.1 um and the upper metal contact island 150 having a length of 0.08 um and a width of 0.08 um.

Referring again to FIG. 1, the MRAM memory cell 100 may also include source and drain region metal contact pads (MD) and gate structure metal contact pads (MP). In some embodiments, the first and second gate structures 118, 120 are formed as replacement gates of metal or other conductive materials. Furthermore, the MRAM memory cell 100 may include a plurality of vias V0, V1, V2, V3, V4 and V5 interconnecting layers or segments of layers with one another. In one embodiment of the invention, all of the vias are different vias, however the scope of the present disclosure covers some of the vias being shared vias.

According to an embodiment of the present disclosure, signals, such as voltage signals, may be applied to the BL 152, the WL 144, and/or the common SL 126 for driving the MTJ 106. For example, the MTJ may be driven for storing a bit (i.e., a 0 or 1) or accessing a stored bit. The signals applied to the BL 152, the WL 144 and/or the common SL 126 determine whether the MJT 106 is driven to write a data bit of 0 or 1 or read a stored data bit.

Figure 7A:
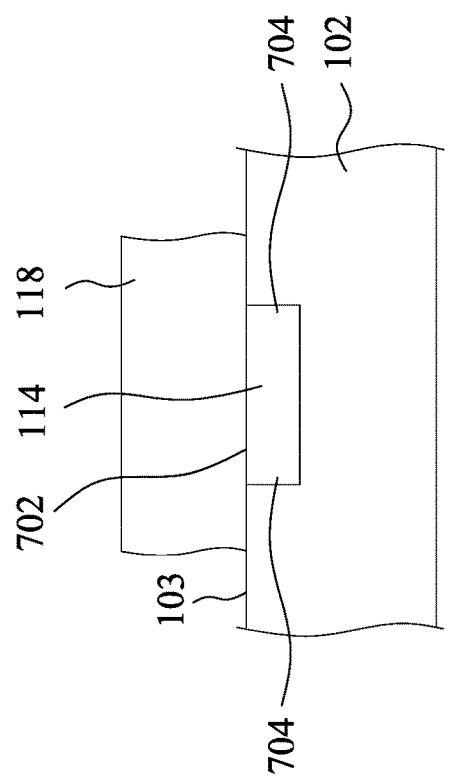
FIG. 7A is a y-z cross section slicing through the gate structure of the MRAM memory cell of FIG. 1, according to an embodiment of the present disclosure.

FIG. 7A is a y-z cross section slicing through the gate structure 118 of the MRAM memory cell 100 of FIG. 1, according to an embodiment of the present disclosure. The transistor 104 is configured as a planar FET 104. The first channel region 114 has a top surface 702 and two side surfaces 704. The second channel region 116 also has top and side surfaces (not shown). The first gate structure 118 overlies the top surface 702 of the first channel region 114 and although not shown, the second gate structure 120 overlies a top surface of the second channel region 116.

Figure 7B:
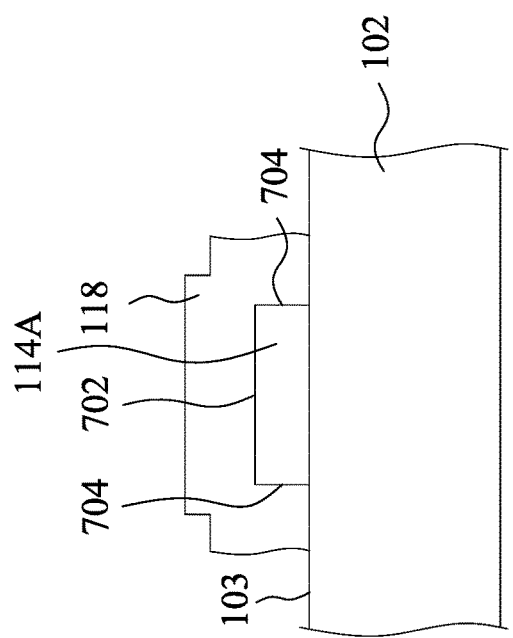
FIG. 7B is a y-z cross section slicing through the gate structure of the MRAM memory cell of FIG. 1, according to another embodiment of the present disclosure.

FIG. 7B is a y-z cross section slicing through the gate structure 118 of the MRAM memory cell 100 of FIG. 1, according to another embodiment of the present disclosure. The transistor 104 is configured as a non-planar FET 104, such as a FinFET. The first and second gate structures 118, 120 are non-planar. For example, the first gate structure 118 surrounds (i.e., wraps around) the top surface 702 and the two side surfaces 704 of the first channel regions 114, such as the first channel region 114A. Although not illustrated, the second gate structure 120 surrounds a top surface and two side surfaces of the second channel regions 116, such as the second channel region 116A (FIG. 2). The first and second source regions 108A, 110A, the drain region 112A, and the first and second channel regions 114A, 116A of the FinFET transistor 104 may be either extended from their respective portions formed in the substrate 102 or built on the top surface 103 (FIG. 1) of the substrate 102. In one embodiment, the substrate 102 is an oxide, such as a silicon oxide. The oxide may be formed over a silicon base layer.

Figure 8:
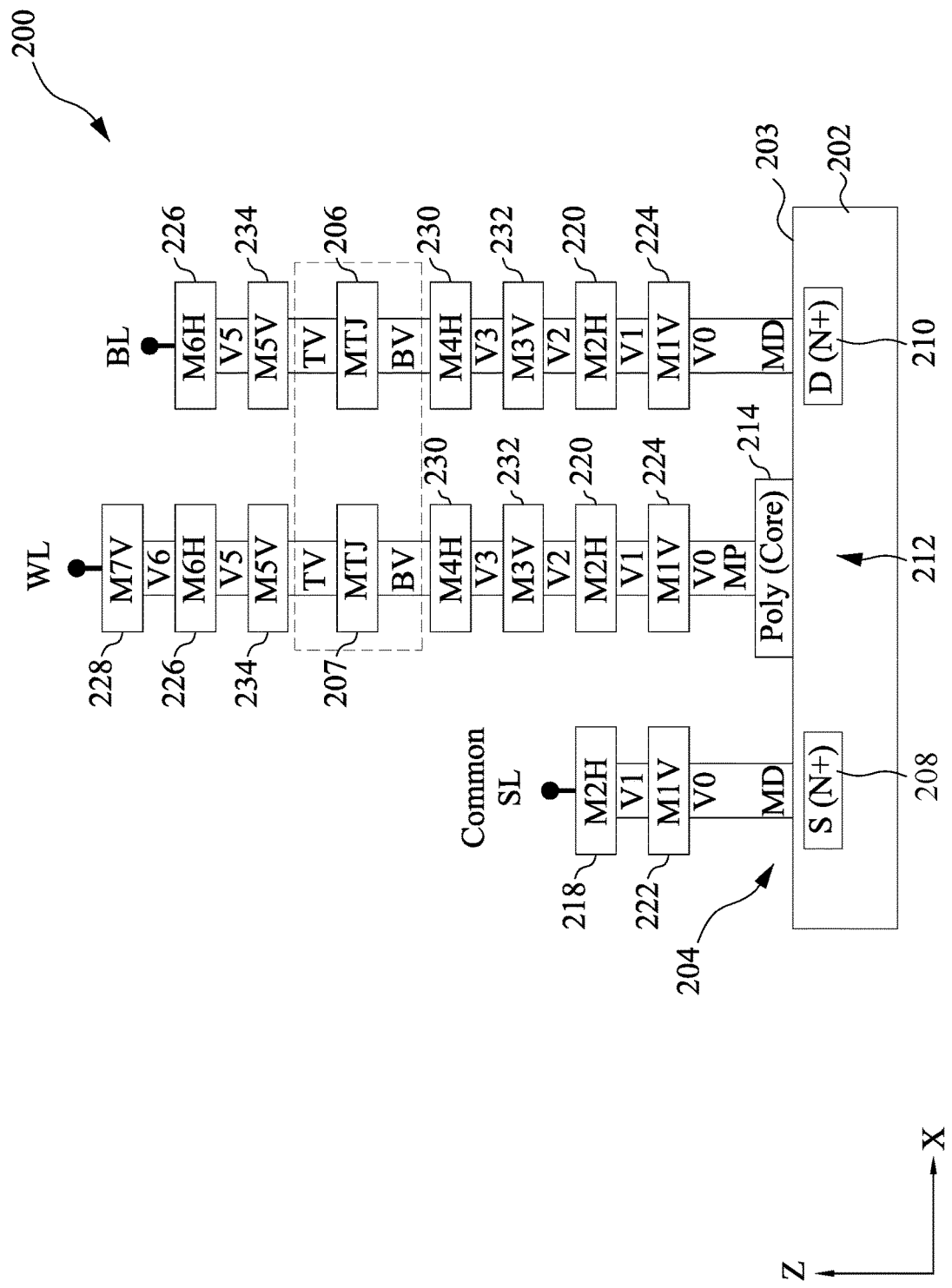
FIG. 8 is an x-z cross-section of a MRAM memory cell 200, according to an embodiment of the present disclosure.
Figure 9:
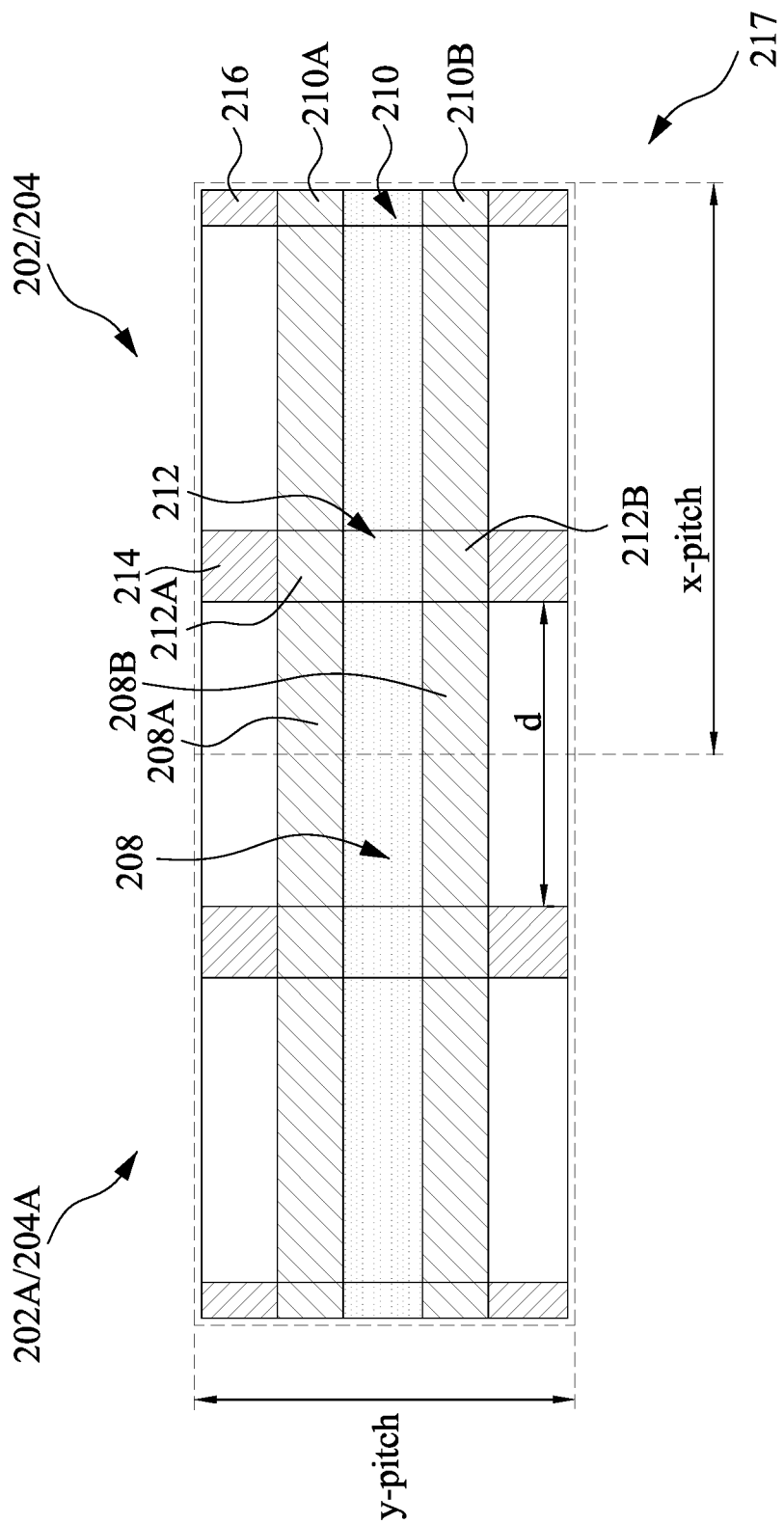
FIG. 9 is a top-down view of the substrate/transistor of the MRAM memory cell of FIG. 8 and a neighboring substrate/transistor associated with a neighboring MRAM cell that form a pair of bitcells, according to an embodiment of the present disclosure.
Figure 10E:
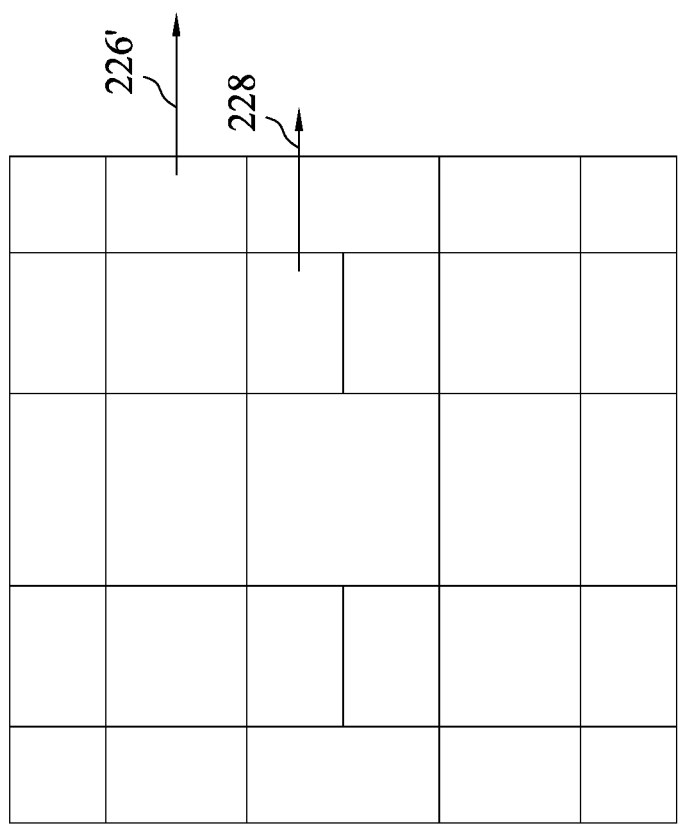
FIG. 10E is a top-down view of the sixth and seventh metal layer overlying the substrate/transistors of the pair of bitcells of FIG. 9 and the neighboring substrate/transistors of three neighboring pairs of bitcells, according to an embodiment of the present disclosure.

The following description references FIGS. 8-10E. FIG. 8 is an x-z cross-section of a MRAM memory cell 200 and FIG. 9 is a top-down view of the substrate/transistor of the MRAM memory cell 200 of FIG. 8 and a neighboring substrate/transistor associated with a neighboring MRAM cell that form a pair of bitcells. FIG. 10A is a top-down view of first and second metal layers overlying the substrate/transistors of the pair of bitcells of FIG. 9 and the neighboring substrate/transistors of three neighboring pairs of bitcells, FIG. 10B is a top-down view of a third metal layer overlying the substrate/transistors of the pair of bitcells of FIG. 9 and the neighboring substrate/transistors of three neighboring pairs of bitcells, FIG. 10C is a top-down view of a fourth metal layer overlying the substrate/transistors of the pair of bitcells of FIG. 9 and the neighboring substrate/transistors of three neighboring pairs of bitcells, FIG. 10D is a top-down view of a fifth metal layer overlying the substrate/transistors of the pair of bitcells of FIG. 9 and the neighboring substrate/transistors of three neighboring pairs of bitcells and FIG. 10E is a top-down view of sixth and seventh metal layers overlying the substrate/transistors of the pair of bitcells of FIG. 9 and the neighboring substrate/transistors of three neighboring pairs of bitcell, according to embodiments of the present disclosure.

Referring to FIG. 8, the MRAM memory cell 200 includes a substrate 202, a transistor 204 and a magnetic tunnel junction (MTJ) 206 overlying the substrate 202. The transistor 204 is configured to drive the MTJ 206 for writing data to the MTJ 206 and reading data from the MTJ 206. The MTJ 206 is configured to store a bit of data.

The transistor 204 includes a common source region 208 formed at least in or on the substrate 202, a drain region 210 formed at least in or on the substrate 202 and at least one channel region 212 formed at least in or on the substrate 202 between the common source region 208 and the drain region 210. The transistor 204 further includes an active gate structure 214 overlying the at least one channel region 212 and a redundant gate structure 216 (FIG. 9) overlying the substrate 202. The redundant gate structure 216 is coupled to a ground potential (not shown). Referring to FIG. 9, an x-pitch of the MRAM memory cell 200 is defined to be the distance between the common source region 208 and the redundant gate structure 216 (i.e., a length of the MRAM memory cell 200). The x-pitch of the MRAM memory cell is 1.5 d, where d is defined to be the distance between adjacent gate structures. For example, d is referred to as the poly pitch when the gate structures are formed of polysilicon. Referring again to FIG. 8, the magnetic tunnel junction 206 is coupled to the drain region 210. The common source region 208 (FIG. 9) is also the source region of a neighboring transistor 204A formed in (or on) the neighboring substrate 202A, collectively referred to as 202A/204A (FIG. 9), and associated with a neighboring MRAM memory cell. The MRAM memory cell 200, which includes the substrate 202 and the transistor 204 that are collectively referred to as 202/204 (FIG. 9), and the neighboring MRAM memory cell associated with the neighboring transistor and neighboring substrate 202A/204A, form a pair of bitcells 217 (FIG. 9) sharing the common source region 208.

In one embodiment, the transistor 204 is a field-effect transistor (FET), such as a metal-oxide-semiconductor field-effect transistor (MOSFET). The transistor 204 may by formed as a planar FET or as a non-planar FFT, such as a fin field-effect transistor (FinFET). FinFETs may have one or more non-planar gate structures for wrapping around one or more channel regions.

According to an embodiment, the substrate 202 may be a formed of silicon, or other semiconductor materials, such as GaAs, and the source and drain regions 208, 210 may be n+ (p+) doped regions and the channel region 212 may be a p (n) doped region.

In one embodiment, the x-pitch of the MRAM memory cell 200 is 0.09 um-0.27 um and a y-pitch of the MRAM memory cell 200 is 0.096 um-0.24 um. In another embodiment, the x-pitch of the MRAM memory cell 200 is 0.135 um and/or the y-pitch of the MRAM memory cell 200 is 0.144 um.

According to an embodiment of the present disclosure, and as discussed further below, the MRAM memory cell 200 may include at least seven metal layers overlying the substrate 202 and vias for connecting the metal layers, or segments of the metal layers, to one another. The seven or more metal layers may be referred collectively as back-end-of-the-line (BEOL) metallization that couples transistors and other components formed in or on the substrate 202 with other circuitry, components, data lines, and power sources.

According to another embodiment, the MRAM memory cell 200 (FIG. 8) includes a second metal layer having a first segment 218 (FIG. 8, FIG. 10A) and a second segment 220 (FIG. 8, FIG. 10A). The first segment 218 is configured as a common source line (common SL, FIG. 8) for receiving a source line signal. The common source line 218 is coupled to the common source region 208 and a second common source region (not shown) of a second pair of bitcells 217A (FIG. 10A) to form four bitcells coupled to (i.e., sharing) the common source line 218. In one embodiment, a first metal layer includes a first segment 222 (FIG. 8, FIG. 10A) and a second segment 224 (FIG. 8, FIG. 10A). The common source line 218 (FIG. 8, FIG. 10A) may be coupled to the common source region 208 (FIG. 8) and the second common source region via a first segment 222 (FIG. 8, FIG. 10A) of the first metal layer.

Furthermore, the MRAM memory cell 200 includes a sixth metal layer 226 (FIG. 8, FIG. 10E) configured as a bit line (BL, FIG. 8) and coupled to the magnetic tunnel junction 206 (FIG. 8). In addition, a MRAM memory cell 200 includes a seventh metal layer 228 (FIG. 8, FIG. 10E) configured as a word line (WL, FIG. 8) and coupled to the active gate structure 214 (FIG. 8).

In one embodiment of the present disclosure, the magnetic tunnel junction 206 is the magnetic tunnel junction 106 illustrated by FIG. 5. The magnetic tunnel junction 206 includes the lower ferromagnetic layer 502, the upper ferromagnetic layer 504 and the tunnel barrier layer 506 positioned between the lower ferromagnetic layer 502 and the upper ferromagnetic layer 504.

The MRAM memory cell 200 further includes a fourth metal layer 230 (FIG. 8, FIG. 10C) configured as a lower metal contact island having a length of 0.08 um and a width of 0.06 um. The lower metal contact island 230 (FIG. 8) is coupled to the lower ferromagnetic layer 502 of the MTJ 206 and the drain region 210. In one embodiment, the drain region 210 (FIG. 8) is coupled to the lower metal contact island 230 via a third metal layer 232 (FIG. 8, FIG. 10B). In another embodiment, the drain region 210 (FIG. 8) is coupled to the lower metal contact island 230 via the second portion 224 of the first metal layer, the second portion 220 of the second metal layer, and the third metal layer 232.

Furthermore, the MRAM memory cell 200 includes a fifth metal layer 234 (FIG. 8, FIG. 10D) configured as an upper metal contact island having a length of 0.1 um and a width of 0.08 um. The fifth metal layer 234 (FIG. 8) couples to the upper ferromagnetic layer 504 of the MTJ 206 and the sixth metal layer 226 (i.e., the bit line).

According to another embodiment of the present disclosure, the MRAM memory cell 200 may include a redundant magnetic tunnel junction 207 (FIG. 8) overlying the substrate 202 and coupled to the word line 228. The word line 228 may receive a word line signal (e.g., voltage), and the active gate structure 214 receives the word line signal via the redundant magnetic tunnel junction 207. In one embodiment, the redundant MTJ 207 is configured to pass signals received from the word line 228 to the active gate structure 214. The MRAM memory cell 200 does not utilize the redundant MTJ 207 for data read or write. In one embodiment, the redundant magnetic tunnel junction 207 is the same as the magnetic tunnel junction 206, including the lower ferromagnetic layer 502, the upper ferromagnetic layer 504 and the tunnel barrier layer 506 positioned between the lower ferromagnetic layer 502 and the upper ferromagnetic layer 504. Formation of the redundant magnetic tunnel junction 207 may allow the same set of masks to be used in the fabrication of the metal layers (i.e., 220, 224, 226, 230, 232 and 234) and the magnetic tunnel junctions 206, 207 that form at least some of the components coupled to the WL 228 and the BL 226. Alternatively, at least the set of masks associated with forming the magnetic tunnel junction 206 may also be used in forming the redundant magnetic tunnel junction 207, which is then used as an electrical conduit for passing signals from the word line 228 to the active gate structure 214.

According to an embodiment, the MRAM memory cell 200 includes two channel regions 212A and 212B (FIG. 9). According to another embodiment, the common source region 208 includes two common source region fin portions 208A, 208B extending above, or alternatively positioned on a top surface 203 of, the substrate 202, the drain region 210 includes two drain region fin portions 210A, 210B extending above, or alternatively positioned on a top surface 203 of, the substrate 202. Each of the two channel regions 212A, 212B include a channel region fin portion extending above, or alternatively positioned on a top surface 203 of, the substrate 202 between the respective common source region fin portions 208A, 208B and the drain region fin portions 210A, 210B. As illustrated by FIG. 7B, each channel region fin portion may include an upper surface 702 and two side surfaces 704. In one embodiment, the active gate structure 214 surrounds the upper surface 702 and the two side surfaces 704 of each channel region fin portion 212A, 212B.

Figure 11:
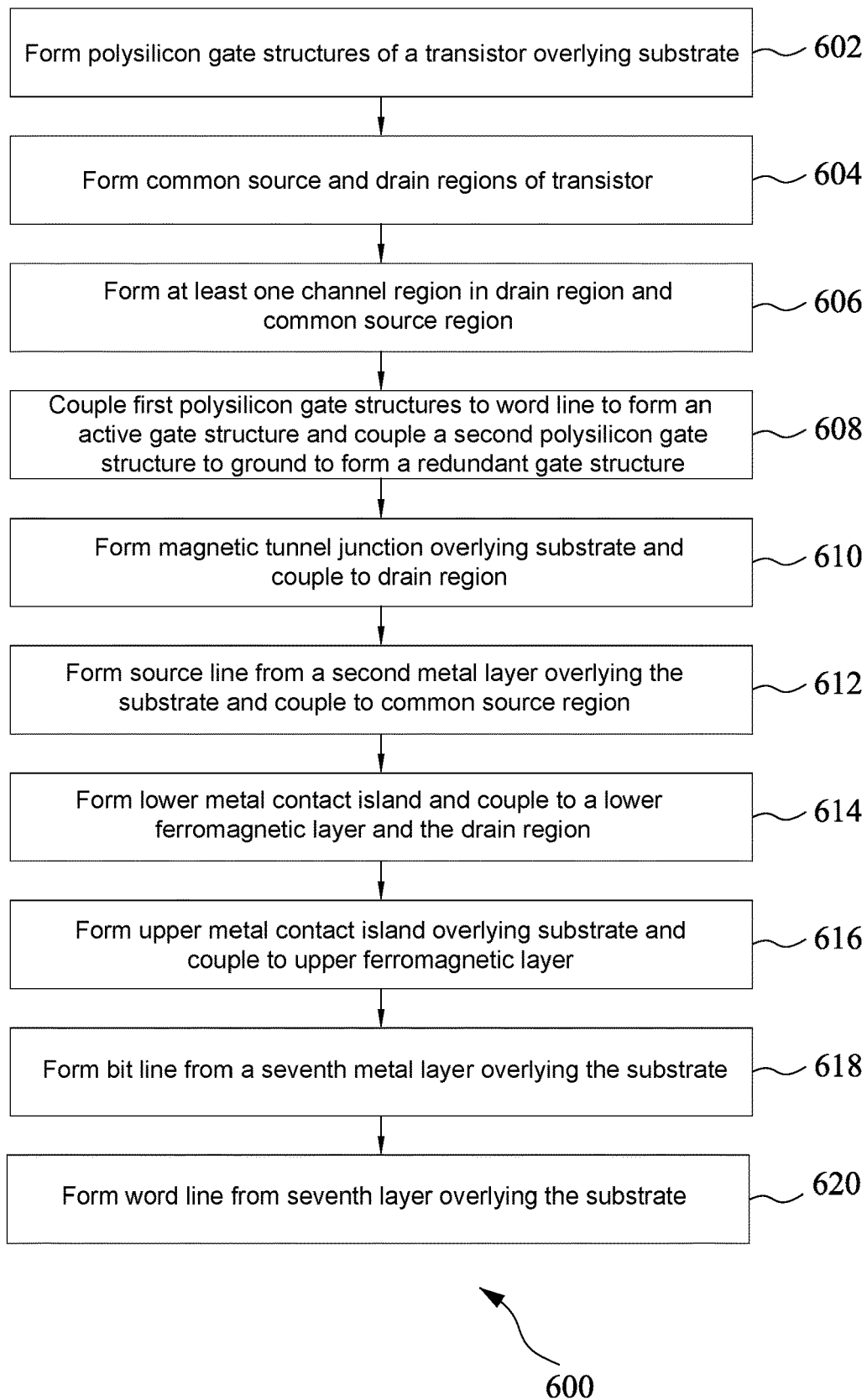
FIG. 11 is a flowchart of a method for forming a MRAM memory cell, according to an embodiment of the present disclosure.

FIG. 11 is a flowchart of a method 600 for forming a MRAM memory cell, according to an embodiment of the present disclosure. For example, the method 600 may form the MRAM memory cell 200.

In step 602, polysilicon gate structures of a transistor are formed overlying the substrate. For example, a polysilicon layer deposited on the substrate may be patterned in a photolithography step using a gate mask for forming the polysilicon gate structures having a periodicity d.

In step 604, common source and drain regions of the transistor are formed in or on a substrate. The substrate may be semiconductor substrate, such as silicon. Or alternatively, the substrate may be an oxide formed on a silicon base layer, and/or the source/drain regions of the transistor may be formed on the substrate, e.g., on a top surface of the substrate, thereby forming fin structures. Alternatively, the source/drain regions may have first respective portions formed in the substrate and second respective portions extending above the substrate, thereby forming fin structures. The common source region may be formed as a source region for the transistor and a neighboring transistor. The neighboring transistor may drive a neighboring MRAM memory cell.

In step 606, at least one channel region is formed between the drain region and the common source region. The channel region may be formed in or on the substrate, e.g., on a top surface of the substrate.

In step 608, a first polysilicon gate structure overlying the at least one channel region is coupled to a word line for forming an active gate structure, and a second polysilicon gate structure overlying the substrate and adjacent to the first polysilicon gate structure is coupled to a ground potential for forming a redundant gate structure. Alternatively, the first polysilicon gate structure surrounds a top surface and two side surfaces of the at least one channel region to form a wrap-around gate structure.

The distance between the active and redundant gate structures is d, and a distance between the common source region and the redundant gate structure, which is the x-pitch of the MRAM memory cell array, is 1.5 d. In one embodiment of the present disclosure, the distance d is 90 um.

In step 610, a magnetic tunnel junction is formed overlying the substrate and coupled to the drain region. In one embodiment of the present disclosure, the magnetic tunnel junction comprises a lower ferromagnetic layer, an upper ferromagnetic layer and a tunnel barrier layer positioned between the lower ferromagnetic layer and the upper ferromagnetic layer.

In step 612, a source line is formed from a second metal layer overlying the substrate and coupled to the common source region.

In step 614, a lower metal contact island is formed from a fourth metal layer overlying the substrate and coupled to the lower ferromagnetic layer and the drain region. In one embodiment, the lower metal contact island has a length of 0.1 um and a width of 0.1 um.

In step 616, an upper metal contact island is formed from a fifth metal layer overlying the substrate and coupled to the upper ferromagnetic layer. In one embodiment, the upper metal contact island has a length of 0.08 um and a width of 0.08 um.

In step 618, a bit line is formed from a sixth metal layer and coupled to the upper metal contact island.

In step 620, the word line is formed from a seventh metal layer overlying the substrate.

Although FIG. 11 illustrates method steps in a specific order, the present invention is not so limited. The scope of the present invention covers a different order to the method steps, as well as additional method steps known in the fabrication of FinFet devices and/or MRAM cells. For example, other embodiments for forming a MRAM memory cell include source/drain region doping steps, forming the polysilicon gate structure of step 602 as a dummy gate to act as a mask for the subsequent formation of the source/drain and/or channel regions, and removing and replacing the dummy mask with a second polysilicon gate structure.

According to one embodiment of the present disclosure, an MRAM memory cell includes a substrate, a transistor overlying the substrate and a magnetic tunnel junction overlying the transistor. The transistor includes a first source region, a second source region, a drain region between the first and second source regions, at least one first channel region between the drain region and the first source region, at least one second channel region between the drain region and the second source region, a first gate structure overlying the at least one first channel region and a second gate structure overlying the at least one second channel region. The drain region is coupled to the magnetic tunnel junction. The MRAM memory cell further includes a first metal layer overlying the transistor and a second metal layer overlying the first metal layer. The second and first metal layers are configured to couple a common source line signal to the first and second source regions and to first neighboring first and second source regions of a first neighboring transistor of a first neighboring MRAM memory cell.

Alternatively, at least a portion of the transistor may be at least in or on the substrate, including a first source region at least in or on the substrate, a second source region at least in or on the substrate, a drain region at least in or on the substrate between the first and second source regions, at least one first channel region at least in or on the substrate between the drain region and the first source region, at least one second channel region at least in or on the substrate between the drain region and the second source region, a first gate structure overlying the at least one first channel region and a second gate structure overlying the at least one second channel region.

According to another embodiment of the present disclosure, an MRAM memory cell includes a substrate, a transistor overlying the substrate and a magnetic tunnel junction overlying the transistor. The transistor includes a common source region, a drain region, at least one channel region between the common source region and the drain region, an active gate structure overlying the at least one channel region, and a redundant gate structure positioned over the substrate and outside one of the common source region or the drain region. The redundant gate structure is coupled to a ground potential. The active and redundant gate structures are separated by a distance d. The x-pitch of the MRAM memory cell is a distance between the common source region and the redundant gate structure, and the x-pitch is 1.5 d. The drain region is coupled to the magnetic tunnel junction.

Alternatively, an MRAM memory cell includes a substrate, at least a portion of a transistor at least in or on the substrate, and a magnetic tunnel junction overlying the transistor. The transistor includes a common source region at least in or on the substrate, a drain region at least in or on the substrate, at least one channel region at least in or on the substrate between the common source region and the drain region, an active gate structure overlying the at least one channel region, and a redundant gate structure overlying the substrate. The redundant gate structure is coupled to a ground potential. The active and redundant gate structures are separated by a distance d. The x-pitch of the MRAM memory cell is a distance between the common source region and the redundant gate structure, and the x-pitch is 1.5 d. The drain region is coupled to the magnetic tunnel junction.

According to yet another embodiment of the present disclosure, a method of forming a MRAM memory cell that includes a magnetic tunnel junction and a transistor for driving the magnetic tunnel junction is provided. The method includes forming a drain region of the transistor at least in or on a substrate, forming a common source region at least in or on the substrate, forming at least one channel region between the drain region and the common source region, forming an active gate structure overlying the at least one channel region and coupled to a word line, forming a redundant gate structure overlying the substrate and coupled to a ground potential and forming a magnetic tunnel junction overlying the substrate and coupled to the drain region. The common source region is formed as a source region of the transistor and a neighboring transistor of a neighboring MRAM memory cell. The MRAM memory cell is formed to have an x-pitch of 1.5 d, where d is a distance between the active and redundant gate structures, and where the distance between the common source region and the redundant gate structure is the x-pitch of the MRAM memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An MRAM memory cell, comprising:
a substrate;
a transistor over the substrate and including:
   a first source region;
   a second source region;
   a drain region between the first and second source regions;
   at least one first channel region between the drain region and the first source region;
   at least one second channel region between the drain region and the second source region;
   a first gate structure overlying the at least one first channel region; and
   a second gate structure overlying the at least one second channel region;
a magnetic tunnel junction overlying the transistor, wherein the drain region is coupled to the magnetic tunnel junction;
a first metal layer overlying the transistor; and
a second metal layer overlying the first metal layer, wherein the second and first metal layers are configured to couple a common source line signal to the first and second source regions and to first neighboring first and second source regions of a first neighboring transistor of a first neighboring MRAM memory cell; and
a third metal layer overlying the second metal layer, the third metal layer being configured to couple a word line signal to the first and second gate structures.

2. The MRAM memory cell of claim 1, wherein the at least one first channel region comprises two first channel regions, wherein the at least one second channel region comprises two second channel regions, wherein an x-pitch of the MRAM memory cell is a distance between the first source region and the second source region, wherein the x-pitch of the MRAM memory cell is 0.18 um, and wherein the y-pitch of the MRAM memory cell is 0.144 um.

3. The MRAM memory cell of claim 1, wherein the at least one first channel region comprises three first channel regions, wherein the at least one second channel region comprises three second channel regions, wherein an x-pitch of the MRAM memory cell is a distance between the first source region and the second source region, wherein the x-pitch of the MRAM memory cell is 0.18 um, and wherein the y-pitch of the MRAM memory cell is 0.192 um.

4. The MRAM memory cell of claim 1, wherein the first metal layer includes a first portion having a first segment coupled to the first source region and a second segment coupled to the second source region, and wherein the second metal layer includes a first segment coupled to the first metal layer, the first segment of the second metal layer configured as a common source line.

5. The MRAM memory cell of claim 4, wherein
the first metal layer comprises a second portion coupled to the first neighboring first and second source regions of the first neighboring transistor of the first neighboring MRAM memory cell, a third portion coupled to second neighboring first and second source regions of a second neighboring transistor of a second neighboring MRAM memory cell, and a fourth portion coupled to third neighboring first and second source regions of a third neighboring transistor of a third neighboring MRAM memory cell, wherein
the common source line is coupled to the first and second portions of the first metal layer and to a second common source line coupled to the third and fourth portions of the first metal layer for forming four bitcells configured to receive the common source line signal.

6. The MRAM memory cell of claim 1, wherein the magnetic tunnel junction comprises a lower ferromagnetic layer, an upper ferromagnetic layer and a tunnel barrier layer positioned between the lower ferromagnetic layer and the upper ferromagnetic layer, and wherein the MRAM memory cell further comprises:
   a fourth metal layer configured as a lower metal contact island coupled to the lower ferromagnetic layer and the drain region;
   a fifth metal layer configured as an upper metal contact island coupled to the upper ferromagnetic layer; and
   a sixth metal layer configured as a bit line and coupled to the fifth metal layer.

7. The MRAM memory cell of claim 6, wherein
the at least one first channel region comprises two first channel regions, wherein
the at least one second channel region comprises two second channel regions, wherein
the lower metal contact island has a length of 0.08 um and a width of 0.06 um, and wherein
the upper metal contact island has a length of 0.1 um and a width of 0.08 um.

8. The MRAM memory cell of claim 6, wherein
the at least one first channel region comprises three first channel regions, wherein
the at least one second channel region comprises three second channel regions, wherein
the lower metal contact island has a length of 0.1 um and a width of 0.1 um, and wherein
the upper metal contact island has a length of 0.08 um and a width of 0.08 um.

9. An MRAM memory cell, comprising:
a substrate;
a transistor over the substrate and including:
   a source region;
   a drain region;
   a channel region between the drain region and the source region; and
   a gate structure overlying the channel region;
a magnetic tunnel junction overlying the drain region;
a first metal layer overlying the transistor;
a second metal layer overlying the first metal layer, wherein the second and first metal layers are configured to couple a common source line signal to the source region and to a first neighboring source region of a first neighboring transistor of a first neighboring MRAM memory cell;
a fourth metal layer overlying the second metal layer, wherein the fourth metal layer is configured as a lower metal contact island coupled to the magnetic tunnel junction; and
a third metal layer between the second metal layer and the fourth metal layer, wherein the third metal layer is configured to couple a word line signal to the gate structure.

10. The MRAM memory cell of claim 9, further comprising:
   a fifth metal layer overlying the fourth metal layer, wherein the fifth metal layer is configured as an upper metal contact island coupled to the magnetic tunnel junction.

11. The MRAM memory cell of claim 9, wherein the magnetic tunnel junction includes:
   a lower ferromagnetic layer;
   an upper ferromagnetic layer; and
   a tunnel barrier layer between the lower ferromagnetic layer and the upper ferromagnetic layer;
   wherein the fourth metal layer is coupled to the lower ferromagnetic layer, and the fifth metal layer is coupled to the upper ferromagnetic layer.

12. The MRAM memory cell of claim 11, further comprising:
   a sixth metal layer overlying the fifth metal layer, wherein the sixth metal layer is configured to couple a bit line signal to the upper ferromagnetic layer.

13. The MRAM memory cell of claim 9, further comprising a second channel region between the channel region and the source region.

14. A method, comprising:
   forming a transistor overlaying a substrate, the transistor including:
      a first source region;
      a second source region;
      a drain region between the first and second source regions;
      at least one first channel region between the drain region and the first source region;
      at least one second channel region between the drain region and the second source region;
      a first gate structure overlying the at least one first channel region; and
      a second gate structure overlying the at least one second channel region; and
   forming a magnetic tunnel junction overlying the substrate and coupled to the drain region;
   forming a first metal layer overlying the transistor;
   forming a second metal layer overlying the first metal layer, wherein the second and first metal layers are configured to couple a common source line signal to the first and second source regions and to a first neighboring source region of a first neighboring transistor of a first neighboring MRAM memory cell;
   forming a third metal layer overlying the second metal layer, wherein the third metal layer is configured to couple a word line signal to the first and second gate structures.

15. The method of claim 14, wherein the magnetic tunnel junction comprises:
   a lower ferromagnetic layer;
   an upper ferromagnetic layer; and
   a tunnel barrier layer positioned between the lower ferromagnetic layer and the upper ferromagnetic layer;
   wherein the method further comprises:
      forming a fourth metal layer configured as a lower metal contact island coupled to the lower ferromagnetic layer and the drain region;
      forming a fifth metal layer configured as an upper metal contact island coupled to the upper ferromagnetic layer; and
      forming a sixth metal layer configured as a bit line and coupled to the fifth metal layer.

16. The method of claim 15, wherein:
the at least one first channel region comprises two first channel regions; and
the at least one second channel region comprises two second channel regions.

17. The method of claim 15, wherein:
the at least one first channel region comprises three first channel regions; and
the at least one second channel region comprises three second channel regions.

18. The method of claim 14, further comprising:
   forming a fourth metal layer overlying the third metal layer, wherein the fourth metal layer is configured as a lower metal contact island coupled to the magnetic tunnel junction.

19. The method of claim 18, further comprising:
   forming a fifth metal layer overlying the fourth metal layer, wherein the fifth metal layer is configured as an upper metal contact island coupled to the magnetic tunnel junction.

20. The method of claim 18, wherein the forming a magnetic tunnel junction includes:
   forming a lower ferromagnetic layer;
   forming an upper ferromagnetic layer;
   forming a tunnel barrier layer between the lower ferromagnetic layer and the upper ferromagnetic layer; and
   forming a fifth metal layer overlying the fourth metal layer;
   wherein the fourth metal layer is coupled to the lower ferromagnetic layer, and the fifth metal layer is coupled to the upper ferromagnetic layer.

* * * * *